(12) United States Patent
Fukase

(10) Patent No.: US 8,166,648 B2
(45) Date of Patent: May 1, 2012

(54) METHOD OF MANUFACTURING A WIRING SUBSTRATE

(75) Inventor: Katsuya Fukase, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 445 days.

(21) Appl. No.: 12/395,885

(22) Filed: Mar. 2, 2009

(65) Prior Publication Data

US 2009/0218122 A1  Sep. 3, 2009

(30) Foreign Application Priority Data

Mar. 3, 2008  (JP) .................................. 2008-052353

(51) Int. Cl.
*H05K 3/02* (2006.01)
*H05K 3/10* (2006.01)

(52) U.S. Cl. ................. 29/846; 29/825; 29/849; 216/17

(58) Field of Classification Search ................. 29/846, 29/825, 829, 831, 848, 849; 174/261; 216/17; 257/751, 759
See application file for complete search history.

(56) References Cited

U.S. PATENT DOCUMENTS 6,465,112 B2 * 10/2002 Ikura .............................. 428/624
7,737,555 B2 *  6/2010 Ohto et al. ..................... 257/751

FOREIGN PATENT DOCUMENTS

JP   2005-268353   9/2005
JP   2006-173654   6/2006

* cited by examiner

*Primary Examiner* — Thiem Phan
(74) *Attorney, Agent, or Firm* — Rankin, Hill & Clark LLP

(57) ABSTRACT

There is provided a wiring substrate manufacturing method. The wiring substrate includes: a plurality of conductor patterns formed on a mounting surface on which an electronic component is to be mounted, wherein each of the conductor patterns is covered with a corresponding one of solder layers; and partition walls made of insulating material and formed along the conductor patterns on the mounting surface such that each of the partition walls is provided between the adjacent conductor patterns with a clearance interposed therebetween.

5 Claims, 9 Drawing Sheets

METHOD OF MANUFACTURING A WIRING SUBSTRATE

This application claims priority from Japanese Patent Application No. 2008-052353, filed on Mar. 3, 2008, the entire contents of which are hereby incorporated by reference.

BACKGROUND OF THE INVENTION

1. Technical Field

The present disclosure relates to a wiring substrate and a method of manufacturing the same. More particularly, in the wiring substrate according to the present invention, conductor patterns are formed on a mounting surface of the wiring substrate on which an electronic component is to be mounted, and the whole surfaces of exposed surfaces consisting of contact surfaces, with which bumps of the electronic component is in contact, and both side surfaces of the conductor patterns are covered with a metal brazing layer, and each of the conductor patterns are electrically connected to a corresponding one of the bumps when the metal brazing layer is fused.

2. Related Art

As the wiring substrate having a mounting surface on which a semiconductor element as an electronic component is flip-chip mounted, JP-A-2005-268353 discloses a wiring substrate 10 shown in FIG. 8.

In the wiring substrate 10 shown in FIG. 8, conductor patterns 16, 16, . . . exposed from a solder resist 20 are formed on the mounting surface. As shown in FIG. 9, a solder layer is formed on exposed portions of the conductor patterns 16, 16, . . . respectively. This solder layer is formed by fusing solder powders as metal brazing powders that are adhered onto whole surfaces of the exposed surfaces of the conductor patterns 16, 16, . . . respectively. In JP-A-2005-268353, upon flip-chip mounting a semiconductor element 12 on the wiring substrate 10, as shown in FIG. 9, the solder layers formed on exposed surfaces of the conductor patterns 16, 16, . . . , are fused, and then top ends of bumps 22 of the semiconductor element 12 are brought into contact with corresponding widened portions 16a, 16a, . . . , of the conductor patterns 16, 16, . . . , being covered with a fused solder 100 respectively. At this time, the fused solder 100 that covers the whole surface of the exposed surface of the conductor pattern 16 is gathered around the bump 22 of the semiconductor element 12 by a surface tension, and the bump 22 and the conductor pattern 16 are bonded together and electrically connected each other.

According to the wiring substrate disclosed in JP-A-2005-268353 (the wiring substrate 10 shown in FIG. 8), the fused solder 100 that covers the whole surface of the exposed surface of the conductor pattern 16 can be used in bonding the bump 22 of the semiconductor element 12 and the conductor pattern 16. Hence, without fail, the bump 22 and the conductor pattern 16 can be electrically connected each other.

However, in the wiring substrate 10 shown in FIG. 8 and FIG. 9, the conductor patterns 16, 16, . . . , covered with the solder are formed on a flat mounting surface. Therefore, in such a situation that the conductor patterns 16, 16, . . . , should be formed at a narrow pitch on the wiring substrate 10 to attain a higher density of the conductor patterns 16, 16, . . . , in some cases, a bridge of the fused solder 100 is produced between the adjacent conductor patterns 16, 16, . . . , or a solder residue is caused, as shown in FIG. 10. Even though the bridge of the fused solder 100 or the solder residue is caused, no industrial removing means for removing them are not present. As a result, the wiring substrate 10 in which the bridge of the fused solder 100 or the solder residue is caused must be inevitably regarded as a defective product.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a wiring substrate that can prevent the occurrence of a bridge of a metal brazing material between adjacent conductor patterns and the occurrence of a residue of the metal brazing material even when a pitch between the adjacent conductor patterns is made narrower, and a manufacturing method thereof.

According to one or more aspects of the present invention, there is provided a wiring substrate including: a plurality of conductor patterns formed on a mounting surface on which an electronic component is to be mounted, wherein each of the conductor patterns is covered with a corresponding one of solder layers; and a plurality of partition walls made of insulating material and formed along the conductor patterns on the mounting surface such that each of the partition walls is provided between the adjacent conductor patterns with a clearance interposed therebetween.

According to one or more aspects of the present invention, there is provided a method of manufacturing a wiring substrate. The method includes: (a) forming a plurality of conductor patterns on a mounting surface on which an electronic component is to be mounted; (b) covering the conductor patterns with an insulating layer; and (c) exposing top surfaces of the conductor patterns, which the electronic component is to contact; (d) forming grooves in the insulating layer such that the grooves are provided along side wall surfaces of the conductor patterns; and (e) covering each of the side wall surfaces and the top surfaces of the conductor patterns with a corresponding one of solder layers.

Other aspects and advantages of the invention will be apparent from the following description, the drawings and the claims.

DETAILED DESCRIPTION OF EXEMPLARY EMBODIMENTS OF THE INVENTION

Figure 10:
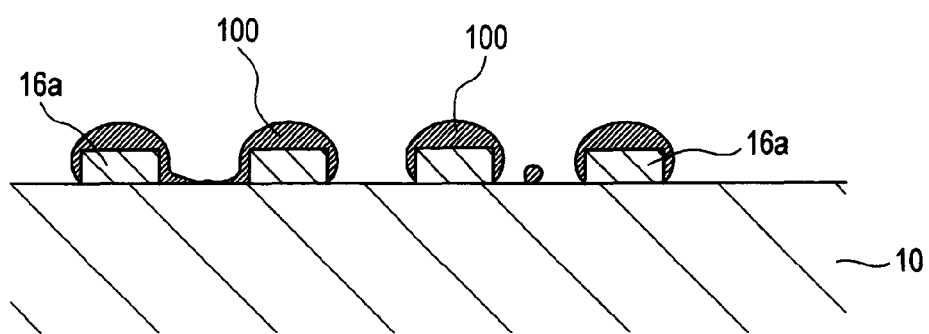
FIG. 10 is an explanatory view explaining problems of the related-art wiring substrate.
Figure 11:
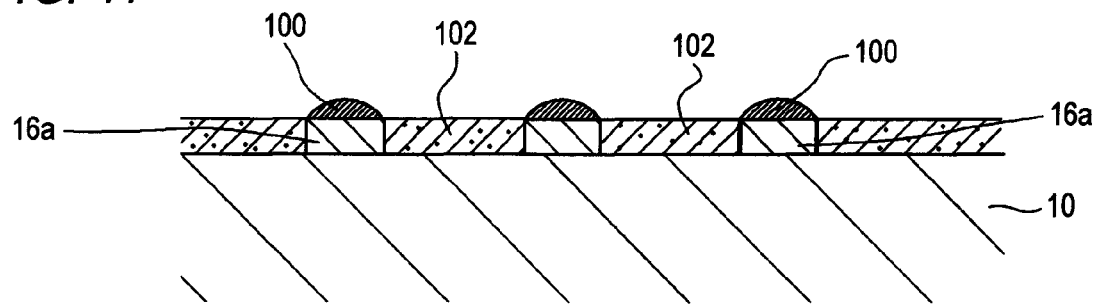
FIG. 11 is an explanatory view explaining an improvement of the related-art wiring substrate.

According to FIG. 11, the wiring substrate 10 has such a structure that respective spaces between the conductor patterns 16, 16 formed on a mounting surface of the wiring substrate 10 are filled with a resin layer 102 such that only contact surfaces of the conductor patterns 16 contacting the bumps 22 of the electronic component 12 respectively are exposed. Even though solder powders adhered onto only the contact surfaces of the conductor patterns 16 shown in FIG. 10 are fused, the fused solder 100 never spreads over the adjacent conductor patterns 16 because the resin layer 102 is provided. However, since the solder powders adhere to only the contact surface of the conductor pattern 16, there is a problem in that an amount of the fused solder 100 is not enough to ensure the contact between the bump 22 of the electronic component 12 and the conductor pattern 16. In view of the above, an embodiment of the invention that solves the above problem will be described hereinafter.

Exemplary embodiments of the present invention will be now described with reference to the drawings.

Figure 8:
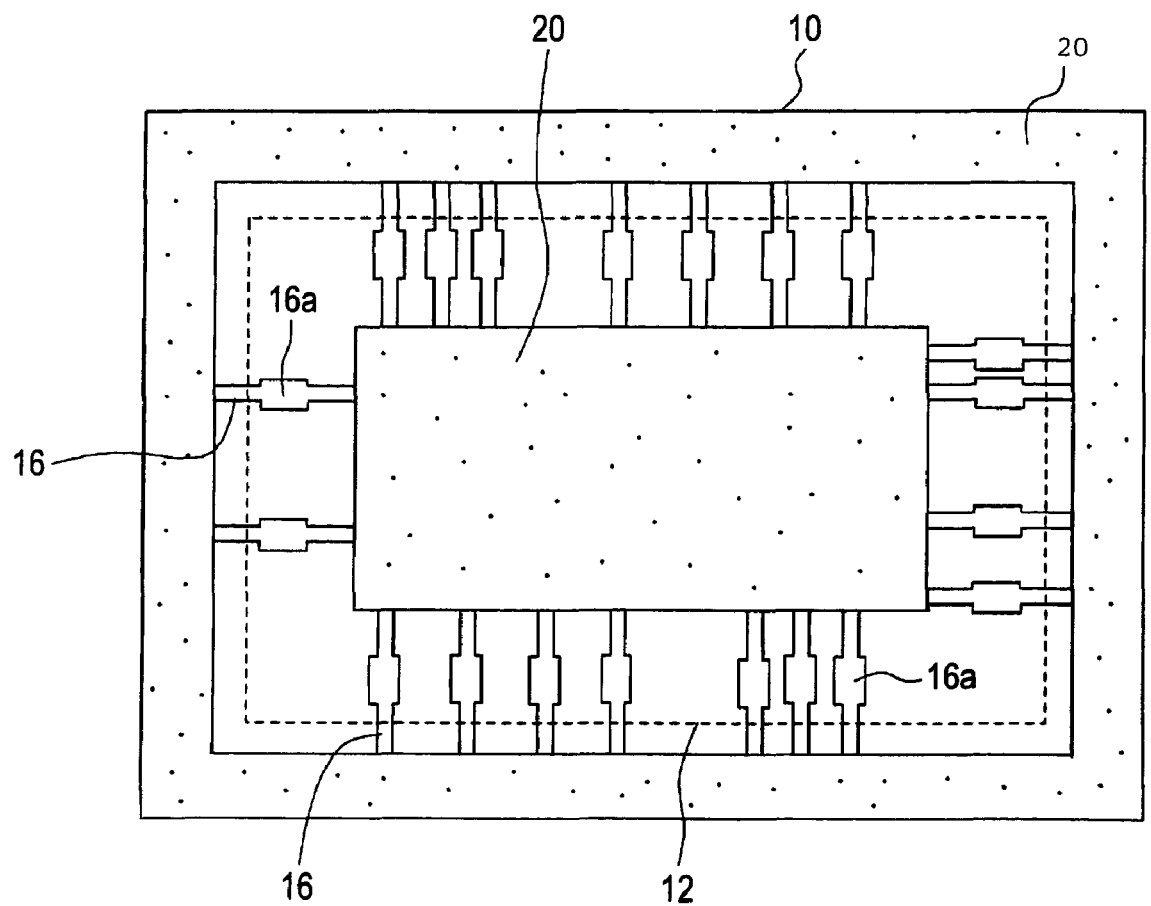
FIG. 8 is a top view explaining an example of a wiring substrate.

In a wiring substrate according to exemplary embodiments of the present invention, like the wiring substrate 10 shown in FIG. 8, the conductor patterns 16, 16, . . . , made of copper are formed the mounting surface, on which the semiconductor element 12 as the electronic component is to be flip-chip mounted, to expose from the solder resist 20. The widened portion 16a with which the bump of the semiconductor element 12 is in contact is formed on exposed portions of the conductor patterns 16, 16, . . . respectively.

Figure 1A:
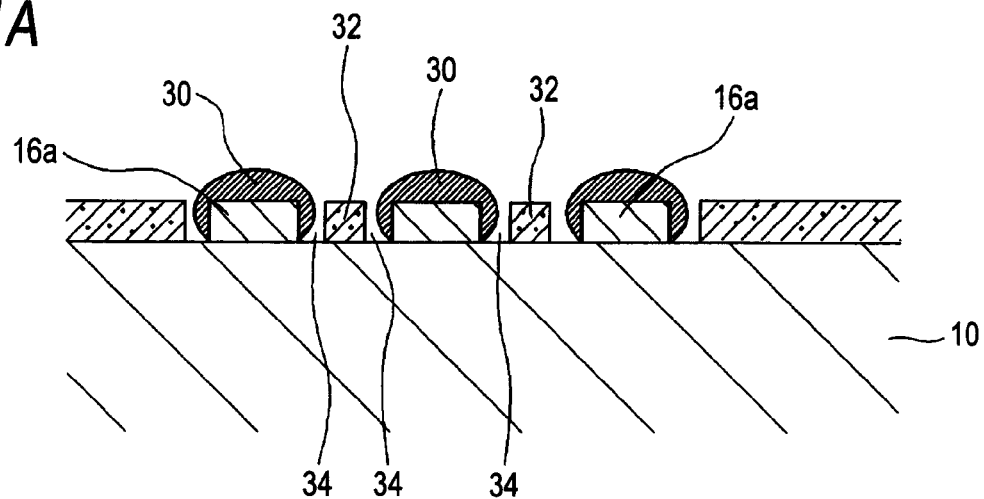
FIGS. 1A and 1B are partially sectional views explaining an example of a wiring substrate according to exemplary embodiments of the present invention.

As shown in FIG. 1A, grooves 34, 34 each having the same width are formed along the conductor patterns 16 on both sides of the conductor patterns 16, 16, . . . , and side wall surfaces of the conductor patterns 16 are exposed in the grooves 34, 34.

Therefore, the contact surface, with which the bump of the semiconductor element 12 is in contact, and the side wall surfaces of the conductor patterns 16, 16, . . . , are exposed respectively. As shown in FIG. 1A, the conductor patterns 16, 16, . . . , are covered with a solder layer 30 as a metal brazing layer.

Figure 1B:
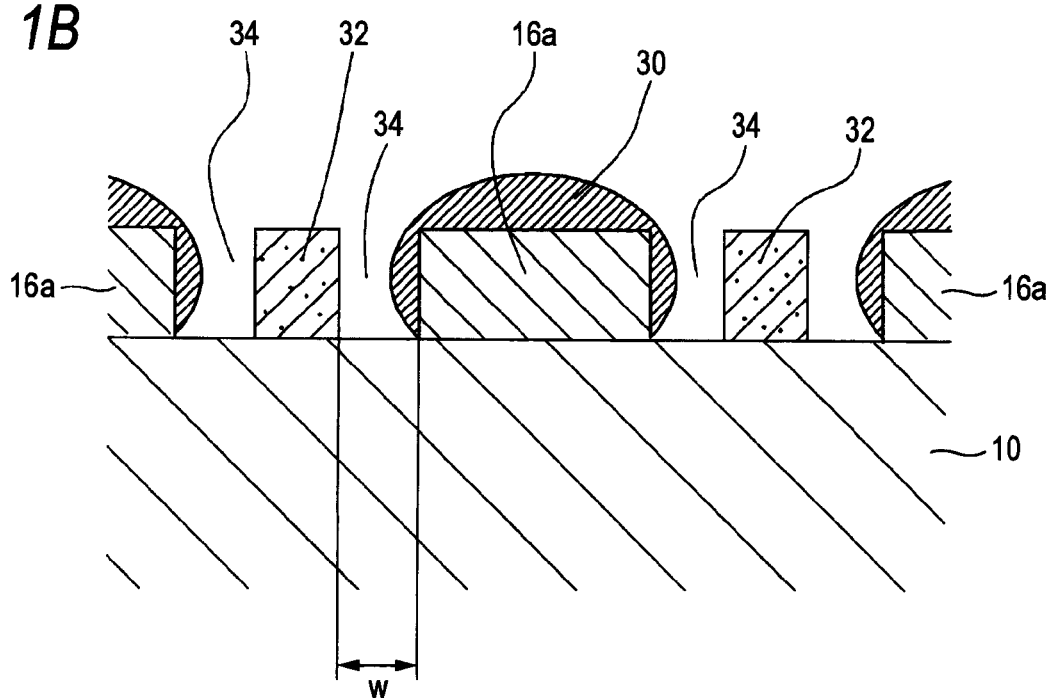

Also, as shown in FIG. 1A, a resin layer 32 as an insulating layer is formed between exposed portions of the conductor patterns 16, 16, . . . , respectively. As shown in FIG. 1B, the resin layer 32 is formed at the same height as the conductor patterns 16. As described later, the resin layer 32 serves as the partition wall that can prevent the outflow of the fused solder toward the adjacent conductor patterns 16, 16, . . . when the solder layer 30 on the conductor patterns 16 is fused.

A width W of each groove 34 is set to the dimension that enables the solder powders to adhere to the side wall surfaces of the conductor patterns 16 in a case where the solder layer 30 is formed by fusing the solder powders adhered to the conductor patterns 16. Concretely, it is preferable that the width W of each groove 34 should be set to about 5 to 20 μm.

Figure 2A:
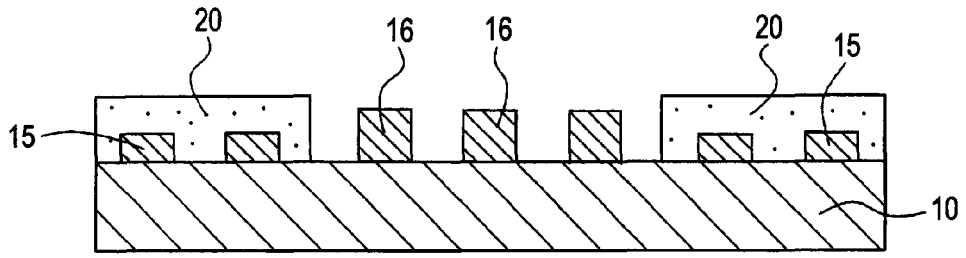
FIGS. 2A to 2E are views explaining a manufacturing process of the wiring substrate shown in FIGS. 1A and 1B.

In forming the wiring substrate 10 shown in FIGS. 1A and 1B, as shown in FIG. 2A, first the conductor patterns 16, 16, . . . made of copper and exposed from the solder resist in a predetermined location are formed on the mounting surface of the wiring substrate 10. Such conductor patterns 16, 16, . . . can be formed by known additive process, semi-additive process, or subtractive process. As shown in FIG. 8, the exposed portion that is exposed from the solder resist 20 is formed on the mounting surface of the wiring substrate 10 in the conductor patterns 16, 16, . . . respectively. Also, as shown in FIG. 8, the widened portion 16a that contacts the top end of each bump 22 of the semiconductor element 12 is formed in the exposed portion respectively. A cross sectional shape of the widened portion 16a is a quadrilateral, as shown in FIG. 2A, and three surfaces consisting of the contact surface, with which each bump 22 of the electronic component 12 is in contact, and both side surfaces are exposed.

Also, conductor patterns 15 shown in FIG. 2A do not contact the bumps 22 of the electronic component 12, and are covered with the solder resist 20.

Figure 2B:
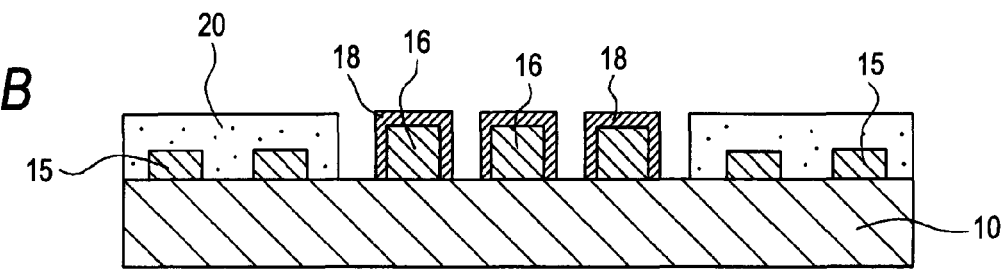

As shown in FIG. 2B, the exposed surfaces of the conductor patterns 16, 16, . . . , are covered with a plated metal layer 18 respectively. The plated metal layer 18 is formed of nickel whose thickness is uniform and which has a predetermined thickness. A thickness of the plated metal layer 18 is set equal to a thickness of the groove 34 to be formed.

This plated metal layer 18 is formed by the electroless plating. Thus, the plated metal layer 18 can be formed easily on the exposed surfaces of the conductor patterns 16, 16, . . . where a power feeding is difficult.

As such electroless plating, the electroless nickel plating is explained hereunder. The plating objective surfaces are defatted, then the soft etching and the acid cleaning are applied, and then the Pd activating process is applied. At this time, a Pd seeding is applied selectively only to the exposed surfaces of the conductor patterns 16. Then, the wiring substrate is dipped into a predetermined electroless nickel plating liquid while a dipping time is controlled. Thus, the plated metal layer 18 whose thickness is uniform and which has a predetermined thickness can be formed only on the exposed surfaces of the conductor patterns 16, 16, . . . .

Figure 2C:
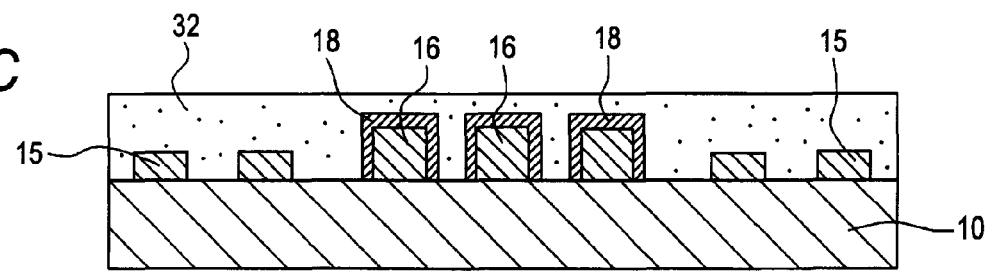
Figure 2D:
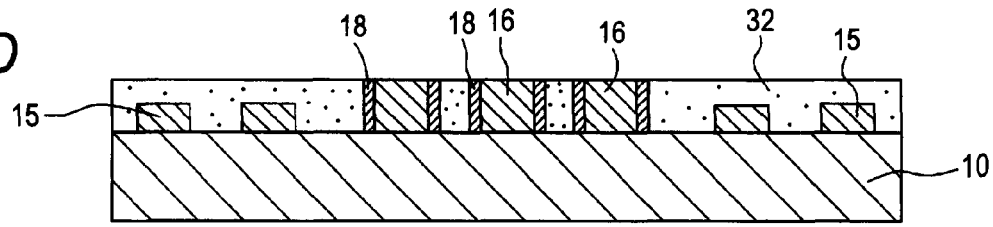

Then, as shown in FIG. 2C, the conductor patterns 16, 16, . . . whose exposed surfaces are covered with the plated metal layer 18 are covered with the resin layer 32. Then, as shown in FIG. 2D, the surfaces of the conductor patterns 16 are exposed by polishing the surface of the resin layer 32. In this manner, the side surfaces of the conductor patterns 16 are covered with the plated metal layer 18 when the surfaces of the conductor patterns 16 are exposed.

Then, the wiring substrate 10 shown in FIG. 2D is dipped into an etchant. This etchant does not etch the copper constituting the conductor patterns 16, but etches the nickel constituting the plated metal layer 18. Thus, the plated metal layer 18 is removed by the etching.

Figure 2E:
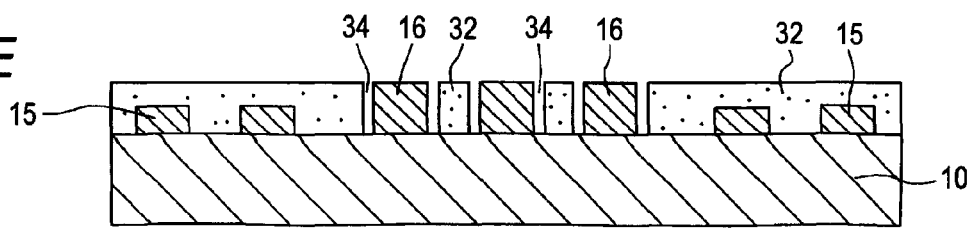

Because the plated metal layer 18 is removed, as shown in FIG. 2E, the groove 34 from which the side wall surface of the conductor pattern 16 is exposed is formed along the side surfaces of the conductor patterns 16, 16, . . . respectively. Such grooves 34, 34, . . . have a uniform width in which the metal brazing layer 30 (see FIG. 1) can be formed on the side wall surface of the conductor pattern 16, respectively. For example, when the solder layer as the metal brazing layer 30 is formed by fusing the solder powders adhered to the exposed surfaces of the conductor patterns 16, the width of the groove 34 is set to the dimension in which the solder powders can adhere to the exposed surfaces of the conductor pattern 16, i.e., two or three times as large as an average particle diameter of the solder powder. Concretely, it is preferable that the width of the groove 34 should be set to about 5 to 20 µm.

At this time, the partition wall formed of the resin layer 32 is formed between the adjacent conductor patterns 16, 16, . . . .

Then, the solder powders are dusted over the adhesive such as a flux adhered to respective exposed surfaces of the conductor patterns 16, 16, . . . and adhered thereto, as shown in FIG. 2E, and then the solder powders are fused. Thus, as shown in FIGS. 1A and 1B, the solder layer 30 as the metal brazing layer is formed on the respective exposed surfaces of the conductor patterns 16, 16 . . . .

Figure 9:
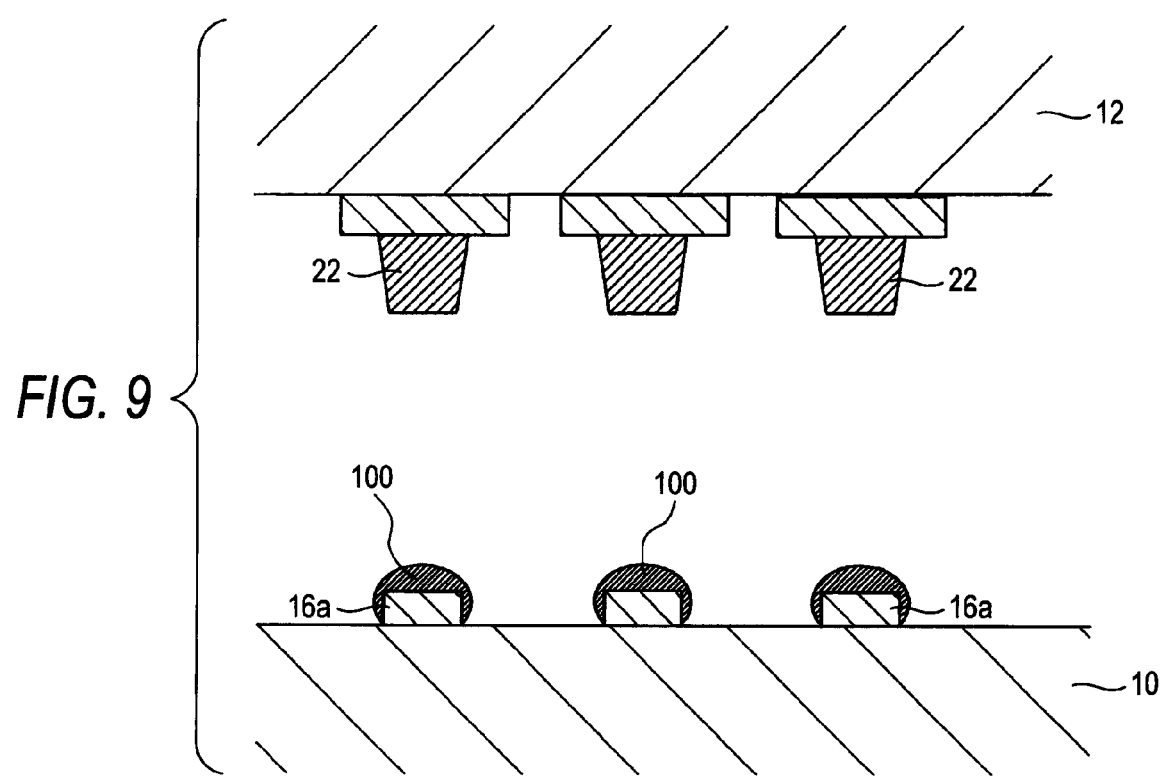
FIG. 9 is an explanatory view explaining a state that a semiconductor element is flip-chip mounted on the related-art wiring substrate.

The solder layer 30 formed on the respective exposed surfaces of the conductor patterns 16, 16, . . . shown in FIGS. 1A and 1B is fused, and then the top ends of the bumps of the semiconductor element 12 are brought into contact with the fused solder layers 30, as shown in FIG. 9. Thus, the fused solder layer 30 covering the whole surface of the exposed surface of the conductor pattern 16 is gathered around the bump 22 of the semiconductor element 12 by a surface tension, and the bump 22 and the conductor pattern 16 are bonded together and electrically connected each other. At this time, in the conductor patterns 16, 16, . . . shown in FIGS. 1A and 1B, the fused solder on three surfaces (i.e., exposed surface consisting of both side surfaces and the contact surface with which the bump 22 of the semiconductor element 12 is in contact) can be utilized in bonding the bump 22 and the conductor pattern 16. As a result, without fail, the bumps 22 and the conductor patterns 16 can be electrically bonded each other.

In addition, the partition wall formed of the resin layer 32 is provided between the adjacent conductor patterns 16, 16, . . . . Therefore, even through the solder layer 30 is formed with a sufficient amount on the respective exposed surfaces of the conductor patterns 16, 16, . . . , such a situation can be prevented that, when the solder layer 30 is fused, a bridge of the fused solder is produced between the adjacent conductor patterns 16, 16, . . . , or a solder residue is caused.

As a consequence, in the wiring substrate 10 on which the conductor patterns 16, 16, . . . are formed as shown in FIGS. 1A and 1B, even when a pitch between the conductor patterns 16, 16, . . . is made narrower, the occurrence of a bridge of the fused solder or a solder residue between the adjacent conductor patterns 16, 16, . . . can be prevented, while keeping an amount of solder that is enough to ensure the contact state between the conductor patterns 16, 16, . . . and the bumps 22 of the electronic component such as the semiconductor element 12, or the like.

In FIGS. 1A and 1B and FIGS. 2A to 2E, the conductor patterns 15 that are covered with the solder resist 20 and do not contact the bumps of the semiconductor element 12 are formed thinner than the conductor patterns 16 each having the exposed surface that is exposed from the solder resist 20. However, as shown in FIG. 3A, the conductor patterns 15 may be formed to have the same thickness as the conductor patterns 16.

Figure 3A:
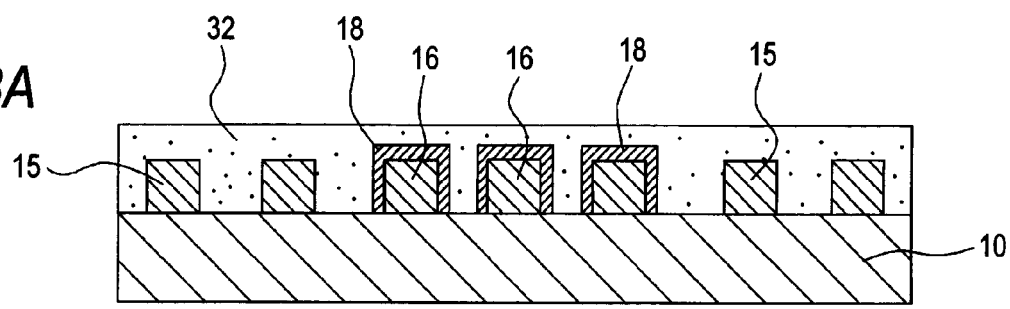
FIGS. 3A to 3C are views explaining another manufacturing process of the wiring substrate shown in FIGS. 1A and 1B.
Figure 3B:
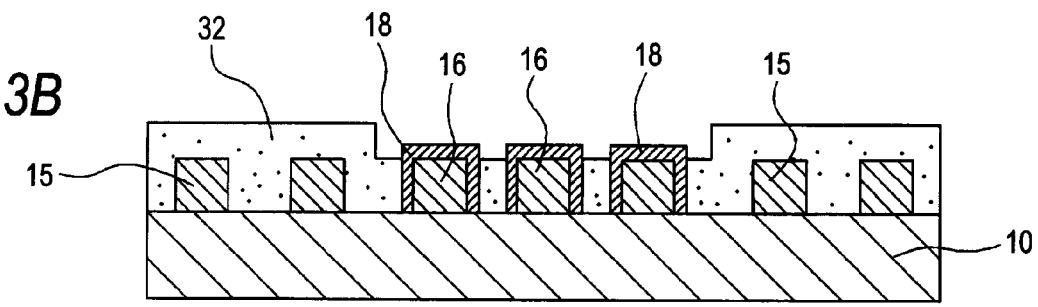

In this case, the exposed surfaces of the conductor patterns 16, 16, . . . shown in FIG. 3A are covered with the plated metal layer 18 whose thickness is uniform and which has a predetermined thickness, and then are covered with the resin layer 32. Then, as shown in FIG. 3B, a recess portion is formed by applying the blast polishing only to the portion of the resin layer 32 corresponding to the conductor patterns 16, 16, . . . such that the plated metal layers 18 of the conductor patterns 16, 16, . . . are exposed from the bottom surface of the recess portion. At that time, a level of blast polishing is adjusted such that, when the plated metal layers 18 are removed, the surfaces of the conductor patterns 16, 16, . . . and the bottom surface of the recess portion constitute the coplanar surface.

Figure 3C:
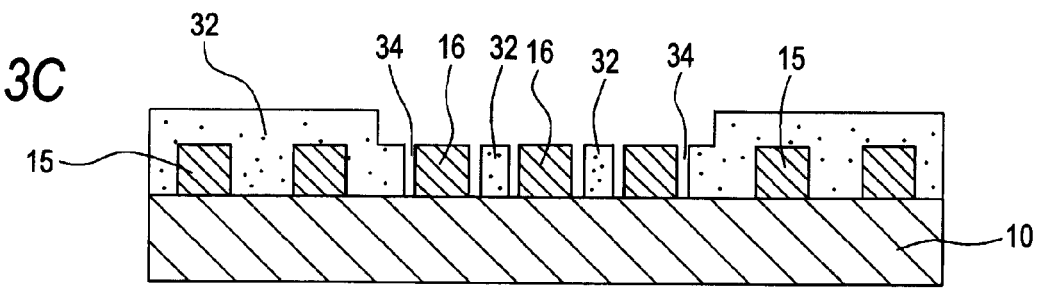
Figure 3D:
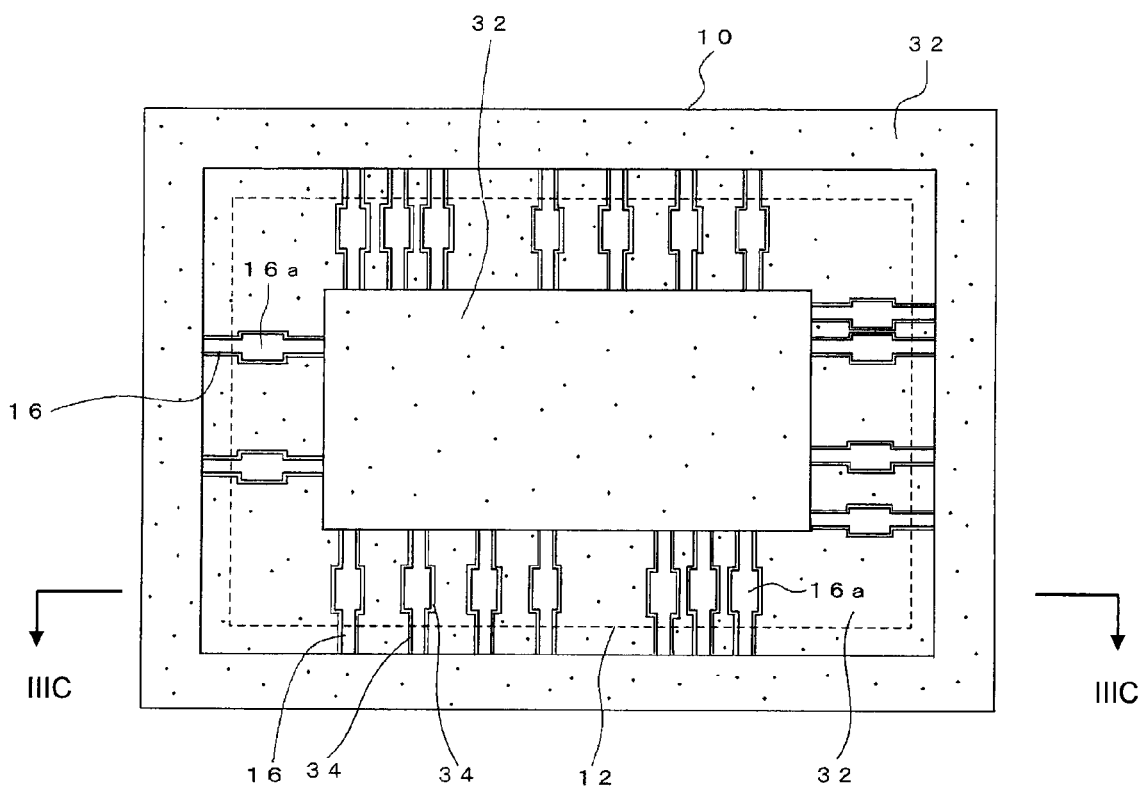
FIG. 3D is a top view showing the wiring substrate shown in FIG. 3C.

Then, only the plated metal layers 18 are removed by the etching. Thus, as shown in FIG. 3C, the respective grooves 34 from which the side surface of the conductor pattern 16 is exposed are formed along respective side surfaces of the conductor patterns 16, 16, . . . . FIG. 3D is a top view showing the wiring substrate shown in FIG. 3C. Also, FIG. 3C is a cross-sectional view taken from line IIIC-IIIC of FIG. 3D.

Figure 4:
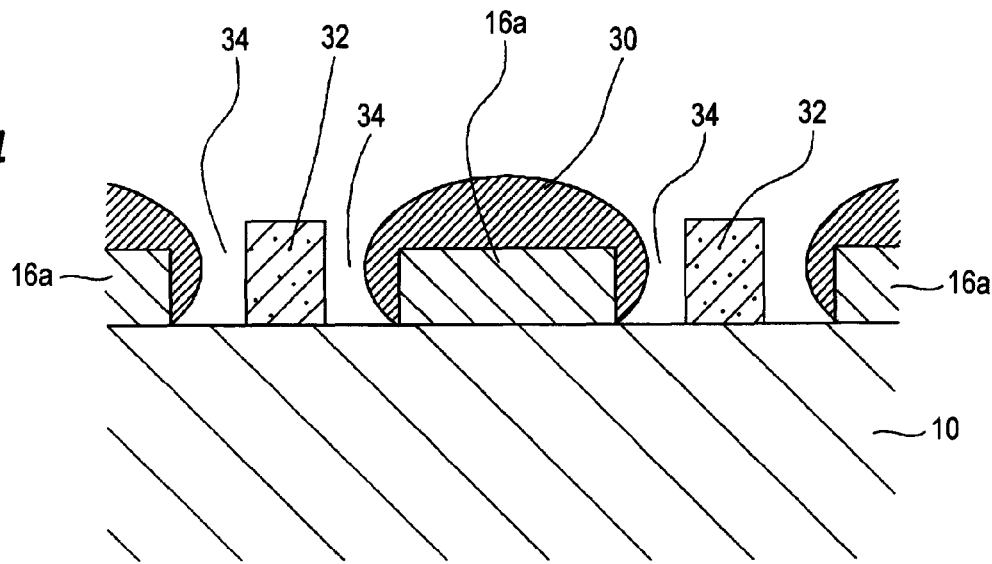
FIG. 4 is a partially sectional view explaining another example of a wiring substrate according to exemplary embodiments of the present invention.

In the wiring substrate 10 shown in FIGS. 1A to 3C, the conductor patterns 16, 16, . . . and the partition walls formed of the resin layer 32 are formed at the same height. However, as shown in FIG. 4, the resin layers 32 constituting the partition walls may be formed higher than the conductor patterns 16, 16, . . . . In this manner, when the resin layers 32 are formed higher than the conductor patterns 16, 16, . . . , the occurrence of a bridge of the fused solder between the adjacent conductor patterns 16, 16, . . . can be prevented more surely even in such a situation that the solder layer 30 is formed with a sufficient amount on the respective exposed surfaces of the conductor patterns 16, 16, . . . and then the solder layer 30 is fused.

Figure 5A:
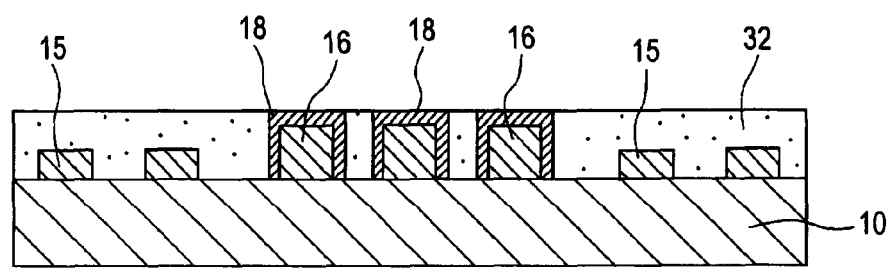
FIGS. 5A and 5B are views explaining a manufacturing process of the wiring substrate shown in FIGS. 3A to 3C.

In order to manufacture the wiring substrate 10 shown in FIGS. 3A to 3C, as shown in FIG. 2C, the resin layer 32 covering the conductor patterns 16, 16, . . . , which are made of copper and which are covered with the plated metal layers 18 made of nickel, is polished by the blast polishing, or the like. Thus, as shown in FIG. 5A, the surfaces of the plated metal layers 18 for covering the conductor patterns 16, 16, . . . are exposed.

Figure 5B:
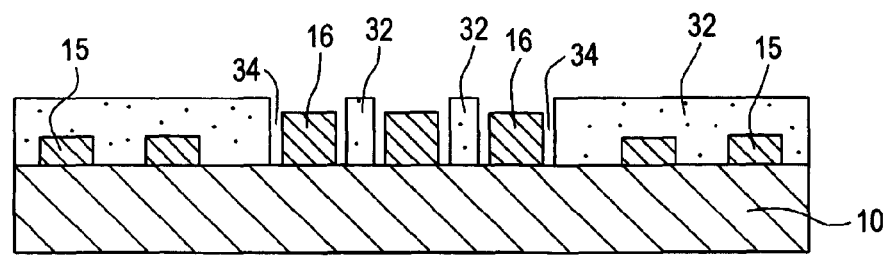

Then, only the plated metal layers 18 are removed by the etching while using the etchant. This etchant does not etch the copper constituting the conductor patterns 16, but etches the nickel constituting the plated metal layer 18. According to such etching process, as shown in FIG. 5B, the conductor patterns 16, 16, . . . can be obtained that are lower than the resin layers 32 serving as the partition wall between the adjacent conductor patterns 16, 16, . . . . The grooves 34, 34 from which the side wall surface of the conductor pattern 16 are exposed are formed along the conductor patterns 16 on both side surfaces of the conductor pattern 16.

Figure 6:
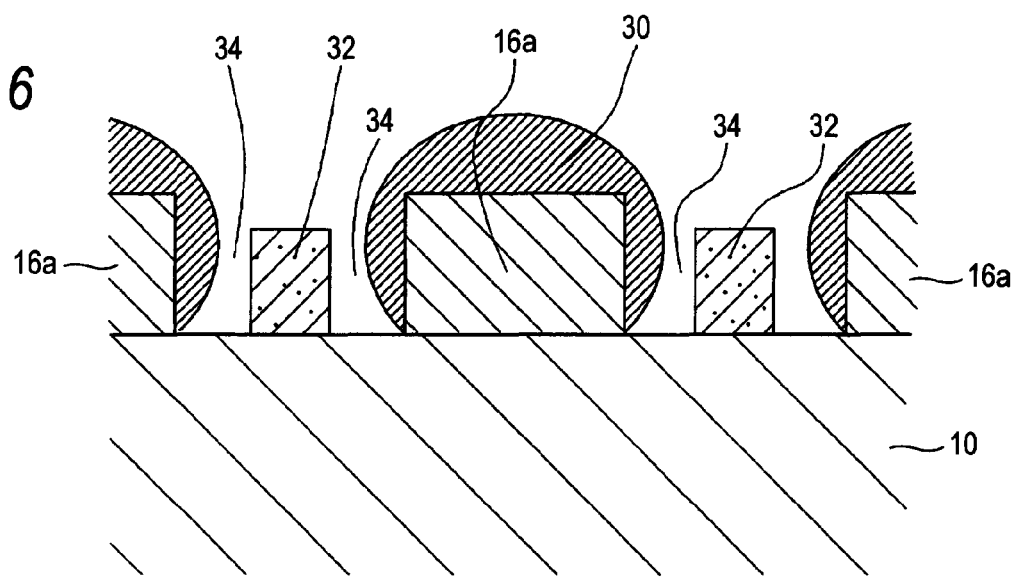
FIG. 6 is a partially sectional view explaining still another example of a wiring substrate according to exemplary embodiments of the present invention.

Also, as shown in FIG. 6, the wiring substrate 10 in which the resin layer 32 serving as the partition wall is lower than the conductor pattern 16 may be formed. In the wiring substrate 10 shown in FIGS. 5A and 5B, the solder layer 30 can be easily formed on the side wall surfaces of the conductor pattern 16 and also the solder layer 30 can be formed that is able to provide a sufficient amount of fused solder.

Figure 7A:
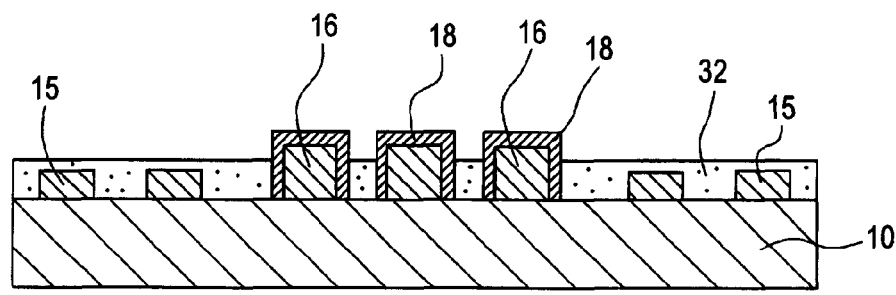
FIGS. 7A and 7B are views explaining a manufacturing process of the wiring substrate shown in FIGS. 5A and 5B.

In order to manufacture the wiring substrate 10 shown in FIG. 6, as shown in FIG. 2C, the resin layer 32 covering the conductor patterns 16, 16, . . . , which are made of copper and covered with the plated metal layers 18 made of nickel, is polished by the blast polishing that blows polishing particles onto the polished surface. According to such blast polishing, the resin layer 32 that is softer than the plated metal layer 18 and the conductor pattern 16 both made of metal is easily polished. Therefore, as shown in FIG. 7A, the plated metal layers 18 and the conductor patterns 16 are protruded from the resin layer 32 after applying the blast polishing to the resin layer 32 for a predetermined time.

Figure 7B:
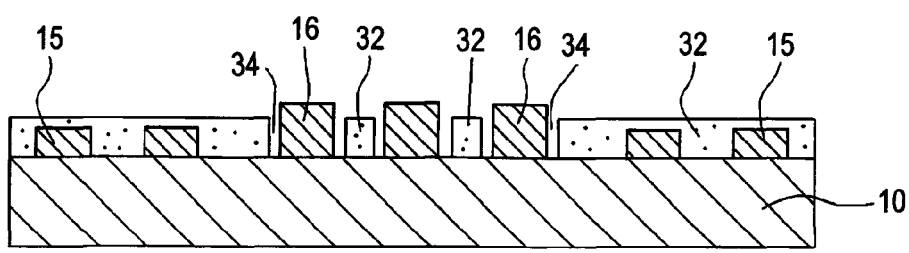

Then, only the plated metal layers 18 are removed by the etching while using the etchant. This etchant does not etch the copper constituting the conductor patterns 16, but etches the nickel constituting the plated metal layer 18. According to such etching process, as shown in FIG. 7B, the conductor patterns 16, 16, . . . can be obtained that are higher than the resin layers 32 serving as the partition wall between the adjacent conductor patterns 16, 16, . . . . The grooves 34, 34 from which the side wall surface of the conductor pattern 16 are exposed are formed along the conductor patterns 16 on both side surfaces of the conductor pattern 16.

In the manufacturing method of the wiring substrate explained as above and shown in FIGS. 1A to 7B, the grooves 34 are formed by etching the plated metal layer 18 formed on the respective exposed surfaces of the conductor patterns 16. In this case, when a variation of the width of the groove 34 is acceptable, the grooves 34 may be formed using a photosensitive resin as the resin layers 32.

Also, the grooves 34 are formed between the resin layers 32, 32. But an insulating layer made of ceramic instead of the resin layer 32 may be used.

According to exemplary embodiments of the present invention, the side wall surfaces of the conductor patterns are exposed in the grooves, and thus the whole surfaces of the exposed surfaces consisting of the contact surface to which the bump of the electronic component contacts and both side surfaces can be covered with the metal brazing layer. Therefore, an amount of fused metal brazing material that is enough to ensure the contact state between the conductor patterns and the bumps of the electronic component can be maintained, and a variation in amount of the fused metal brazing material can be reduced as small as possible. In addition, the partition wall that can prevent the outflow of the fused metal brazing material toward the other conductor patterns is provided between the adjacent conductor patterns respectively. Therefore, even when the metal brazing layer that can provide a sufficient amount of fused metal brazing material is ensured on the exposed surfaces of the conductor patterns, such a situation can be prevented that a bridge of the metal brazing material is produced between the adjacent conductor patterns or a residue of the metal brazing material is caused.

Furthermore, even when a pitch between the conductor patterns of the wiring substrate is made narrower, the occurrence of a bridge of a metal brazing material between adjacent conductor patterns and the occurrence of a residue of the metal brazing material can be prevented, while keeping an amount of solder that is enough to ensure the contact state between the conductor patterns and the bumps of the electronic component.

While the present invention has been shown and described with reference to certain example embodiments, other implementations are within the scope of the claims. It will be understood by those skilled in the art that various changes in form and details may be made therein without departing from the spirit and scope of the invention as defined by the appended claims.

What is claimed is:

1. A method of manufacturing a wiring substrate, the method comprising:
   (a) forming a plurality of first conductor patterns and a plurality of second conductor patterns on a wiring substrate, wherein the first conductor patterns are formed on a mounting surface of the wiring substrate on which an electronic component is to be mounted;
   (b) forming a first insulating layer on the wiring substrate such that the second conductor patterns are covered by the first insulating layer while the first conductor patterns are exposed from the first insulating layer;
   (c) covering the first conductor patterns with metal layers;
   (d) forming a second insulating layer on the wiring substrate so as to cover the first conductor patterns covered by the metal layers and the second conductor patterns covered by the first insulating layer;
   (e) exposing at least top surfaces of the first conductor patterns covered by the metal layers by removing at least portions of the second insulating layer;
   (f) removing the metal layers so as to form grooves in the second insulating layer such that the grooves are provided along side wall surfaces of the second conductor patterns; and
   (g) covering each of the side wall surfaces and the top surfaces of the second conductor patterns with a corresponding one of solder layers.

2. The method according to claim 1, further comprising:
   (h) covering the second conductor patterns with the metal layers such that the thickness of each metal layers is uniform and each of the metal layers has a given thickness,
   wherein step (c) comprises: exposing top surfaces of the metal layers by polishing a top surface of the second insulating layer, and
   wherein step (f) comprises: removing only the metal layers by etching.

3. The method according to claim 2, wherein the metal layers are formed by an electroless plating.

4. The method according to claim 1, wherein the solder layers are formed by fusing solder powders, and a width of each groove is set to a dimension that enables the solder powders to adhere to the side wall surfaces of the second conductor patterns.

5. The method according to claim 1, wherein, in step (f), each width of the grooves is set to about 5 to 20 μm.

* * * * *